United States Patent
Lee et al.

(10) Patent No.: US 11,335,706 B2
(45) Date of Patent: May 17, 2022

(54) THIN FILM TRANSISTOR ARRAY SUBSTRATE FOR HIGH-RESOLUTION DIGITAL X-RAY DETECTOR AND HIGH-RESOLUTION DIGITAL X-RAY DETECTOR INCLUDING THE SAME

(71) Applicant: LG Display Co., Ltd., Seoul (KR)

(72) Inventors: Hanseok Lee, Goyang-si (KR); Hyeji Jeon, Changwon-si (KR); Youngyoung Chang, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 344 days.

(21) Appl. No.: 16/653,609

(22) Filed: Oct. 15, 2019

(65) Prior Publication Data
US 2020/0127014 A1    Apr. 23, 2020

(30) Foreign Application Priority Data
Oct. 18, 2018 (KR) .................. 10-2018-0124615

(51) Int. Cl.
*H01L 27/12* (2006.01)
*H01L 27/146* (2006.01)
*H01L 31/0224* (2006.01)
*H01L 31/115* (2006.01)
*H01L 31/105* (2006.01)

(52) U.S. Cl.
CPC ...... *H01L 27/1214* (2013.01); *H01L 27/1248* (2013.01); *H01L 27/14601* (2013.01); *H01L 27/14603* (2013.01); *H01L 27/14609* (2013.01); *H01L 27/14612* (2013.01); *H01L 27/14632* (2013.01); *H01L 27/14636* (2013.01); *H01L 27/14658* (2013.01); *H01L 27/14663* (2013.01); *H01L 27/14692* (2013.01);

(Continued)

(58) Field of Classification Search
CPC ............... H01L 27/1214; H01L 27/124; H01L 27/1248; H01L 27/14601; H01L 27/14603; H01L 27/14609; H01L 27/14612; H01L 27/14632; H01L 27/14636; H01L 27/14658; H01L 27/14663; H01L 27/14692; H01L 31/0224; H01L 31/105; H01L 31/115
See application file for complete search history.

(56) References Cited

U.S. PATENT DOCUMENTS

| | | | |
|---|---|---|---|
| 2012/0161018 A1* | 6/2012 | Shin ................. | H01L 27/14692 250/370.09 |
| 2013/0001427 A1* | 1/2013 | Okada ................ | G01T 1/24 250/370.09 |

(Continued)

*Primary Examiner* — Mark R Gaworecki
(74) *Attorney, Agent, or Firm* — Seed IP Law Group LLP

(57) ABSTRACT

Disclosed are a thin-film transistor array substrate for a high-resolution digital X-ray detector and a high-resolution digital X-ray detector including the same, in which a photo-sensitivity is improved by increasing a fill factor, a stability of the PIN diode is improved, and generation of parasitic capacitance is reduced or minimized. In one embodiment, the PIN diode maximally extends so that electrodes and contact holes of the thin-film transistor is disposed inside the PIN diode. A planarization layer of organic material is present between the electrodes or wirings. Further, a light receiving region of the PIN diode is increased or maximized by positioning the bias line to overlap the data line or the gate line so as not to overlap with the PIN diode.

19 Claims, 13 Drawing Sheets

(52) U.S. Cl.
CPC ........ *H01L 31/0224* (2013.01); *H01L 31/105* (2013.01); *H01L 31/115* (2013.01); *H01L 27/124* (2013.01)

(56) References Cited

U.S. PATENT DOCUMENTS

2013/0221230 A1* 8/2013 Tredwell ................ G01N 23/04
 250/366
2014/0027828 A1* 1/2014 Kim ...................... G01T 1/2018
 257/292
2018/0356542 A1* 12/2018 Kim ........................ G01T 1/244

\* cited by examiner

THIN FILM TRANSISTOR ARRAY SUBSTRATE FOR HIGH-RESOLUTION DIGITAL X-RAY DETECTOR AND HIGH-RESOLUTION DIGITAL X-RAY DETECTOR INCLUDING THE SAME

CROSS-REFERENCE TO RELATED APPLICATIONS

This application claims the priority of Korean Patent Application No. 10-2018-0124615 filed on 18 Oct. 2018 in the Korean Intellectual Property Office, the disclosure of which is hereby incorporated by reference in its entirety.

BACKGROUND

Technical Field

The present disclosure relates to a thin-film transistor array substrate for a high-resolution digital X-ray detector, and to a high-resolution digital X-ray detector including the same.

Description of the Related Art

Because X-ray is of a short wavelength, the X-ray can transmit an object easily. The transmittance of an X-ray depends on an inner density of the object. Therefore, an internal structure of the object may be observed by detecting the transmittance of the X-ray as transmitted through the object.

One of X-ray based inspection methods used in a medical field is a film printing scheme. However, in the film printing scheme, in order to check a result, an image is shot, and then a film is printed. Thus, it takes a long time to check the result. Especially, in the film printing scheme, there are many difficulties in storing and preserving the printed film.

Recently, a digital X-ray detector (DXD) using a thin-film transistor has been developed and widely used in the medical field.

The digital X-ray detector detects the transmittance of the X-ray transmitted through the object and displays an internal state of the object on a display based on the transmittance.

Therefore, the digital X-ray detector may display the internal structure of the object without using a separate film and a printed paper. Further, the DXD has an advantage that the result may be checked in real time immediately after X-ray photographing.

As a demand for a high-resolution digital X-ray detector increases in recent years, there is a need for development of the high-resolution digital X-ray detector.

BRIEF SUMMARY

The present disclosure provides a thin-film transistor array substrate for a high-resolution digital X-ray detector in which a photo-sensitivity may be improved by increasing a fill factor and to provide a high-resolution digital X-ray detector including the thin-film transistor array substrate.

Further, the present disclosure provides a thin-film transistor array substrate for a high-resolution digital X-ray detector in which interference that may occur between adjacent PIN diodes may be reduced or minimized and to provide a high-resolution digital X-ray detector including the thin-film transistor array substrate.

Furthermore, the present disclosure provides a thin-film transistor array substrate for a high-resolution digital X-ray detector in which stability of a PIN diode may be improved and to provide a high-resolution digital X-ray detector including the thin-film transistor array substrate.

In addition, the present disclosure provides a thin-film transistor array substrate for a high-resolution digital X-ray detector in which parasitic capacitance may be reduced or minimized and to provide a high-resolution digital X-ray detector including the thin-film transistor array substrate.

Furthermore, the present disclosure provides a thin-film transistor array substrate for a high-resolution digital X-ray detector in which a light-receiving area of a PIN diode may be increased or maximized, and to provide a high-resolution digital X-ray detector including the thin-film transistor array substrate.

The present disclosure is not limited to the above-mentioned benefits. Other advantages of the present disclosure, as not mentioned above, may be understood from the following descriptions and more clearly understood from the embodiments of the present disclosure. Further, it will be readily appreciated that the advantages of the present disclosure may be realized by features and combinations thereof as disclosed in the claims.

In one aspect of the present disclosure, there is proposed a thin-film transistor array substrate for a digital X-ray detector including: a thin-film transistor including an active layer, a gate electrode, a first electrode and a second electrode connected to the active layer; a first planarization layer on the thin-film transistor; and a PIN diode on the first planarization layer, the PIN diode including a third electrode connected to the thin-film transistor, a PIN layer and a fourth electrode on the PIN layer, wherein the second electrode is disposed inside the PIN diode. Further, in one aspect of the present disclosure, there is proposed a digital X-ray detector including the thin-film transistor array substrate.

In one implementation of the thin-film transistor array substrate and the digital X-ray detector, an inter-layer insulating layer may be present between the active layer and the first and second electrodes, wherein the active layer may be connected to the first electrode and the second electrode respectively via a first contact hole and a second contact hole formed in the inter-layer insulating layer, wherein the second contact hole may be disposed inside the PIN diode. The first contact hole may be disposed inside a further PIN diode adjacent to the PIN diode.

In one implementation of the thin-film transistor array substrate and the digital X-ray detector, the second electrode and the third electrode may be connected to each other via a third contact hole formed in the first planarization layer, wherein the third contact hole may be disposed inside the PIN diode. The third electrode may be disposed inside the PIN layer.

In one implementation of the thin-film transistor array substrate and the digital X-ray detector, a bias line may be located outside the PIN diode, wherein the bias line may overlap with and extend along a data or gate line and may not extend beyond the data or gate line.

In one implementation of the thin-film transistor array substrate and the digital X-ray detector, a second planarization layer may be present between the fourth electrode of the PIN diode and the bias line.

According to the present disclosure, even when a size of the pixel is reduced to implement a high-resolution digital X-ray detector, a structure that increases or maximizes an area of the PIN diode may be realized, thereby increasing a fill factor to improve a photo-sensitivity of the detector.

Further, according to the present disclosure, the third electrode, as a lower electrode of the PIN diode is positioned inside the PIN diode while increasing or maximizing the area of the PIN diode. Thus, a distance between adjacent third electrodes may be spaced a predetermined distance to reduce or minimize interference between adjacent PIN diodes.

Furthermore, according to the present disclosure, reducing or minimizing a curved portion by disposing the planarization layer under the PIN diode may lead to increasing the stability of the PIN diode.

Furthermore, according to the present disclosure, the occurrence of parasitic capacitances may be reduced or minimized by placing the thick planarization layer between electrodes or interconnects that may overlap with each other due to the structure for increasing or maximizing the area of the PIN diode.

Furthermore, according to the present disclosure, the configuration that the bias line overlaps with and extend along the data or gate line and does not extend beyond the data or gate line such that the bias line does not overlap with the PIN diode may lead to increasing or maximizing of the light receiving area of the PIN diode such that the fill factor may be improved.

Another aspect of the present disclosure is to provide a digital X-ray detector. The digital X-ray detector includes: a thin-film transistor array substrate, the thin-film transistor array substrate including: a base substrate; a plurality of thin-film transistors disposed on the base substrate, wherein each thin-film transistor includes an active layer, a gate electrode, a first electrode and a second electrode connected to the active layer; a planarization layer disposed on the plurality of thin-film transistors; a third electrode connected to each of the thin-film transistor; a PIN layer on the third electrode; and a fourth electrode on the PIN layer.

In one implementation, the second electrode overlaps the PIN layer.

The digital X-ray detector further includes a scintillator layer disposed on the array substrate.

In one implementation, the plurality of thin-film transistors include a first thin-film transistor and a second thin-film transistor adjacent to the first thin-film transistor.

In one implementation, the PIN layer extends between the first thin-film transistor and the second thin-film transistor.

In one implementation, the PIN layer surrounds a top surface and a side surface of the third electrode.

Yet another aspect of the present disclosure is to provide a device. The device includes a plurality of pixels; a thin-film transistor in each pixel of the plurality of pixels; a PIN diode on thin-film transistor.

The PIN diode includes a first electrode connected to the thin-film transistor, the first electrode having a first surface, a second surface, and a third surface; a PIN layer on the first electrode, the PIN layer directly contacting the first surface and the second surface; and a second electrode on the PIN layer.

In one implementation, the first surface and the third surface is opposite to each other, the second surface is transverse to the first surface and the third surface.

In one implementation, a portion of the third surface is connected to the thin-film transistor.

The device according to the present disclosure further includes: a plurality of data lines extending in a first direction; and a plurality of gate lines extending in a second direction, the second direction being transverse to the first direction, the plurality of pixels being electrically connected to the plurality of data lines and the plurality of gate lines.

In one implementation, the thin-film transistor includes a gate electrode, the gate electrode being formed by the gate line.

In one implementation, the PIN layer extends between the gate electrode and the data line.

In addition to the above effects, specific effects of the present disclosure are described below in conjunction with descriptions of specific details to implement the present disclosure.

DETAILED DESCRIPTIONS

Figure 1:
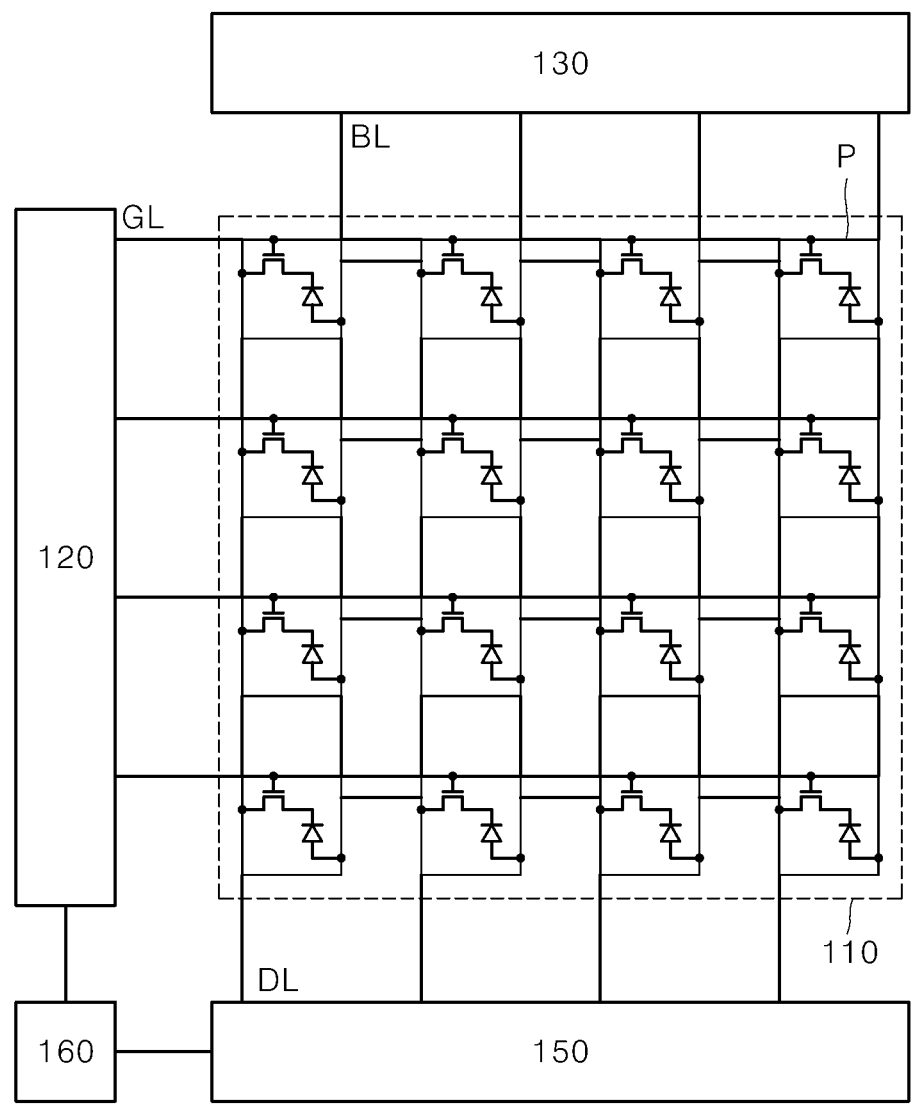
FIG. 1 is a block diagram for schematically illustrating a high-resolution digital X-ray detector.

For simplicity and clarity of illustration, elements in the figures are not necessarily drawn to scale. The same reference numbers in different figures denote the same or similar elements, and as such perform similar functionality. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a thin-film transistor array substrate for a high-resolution digital X-ray detector and a high-resolution digital X-ray detector including the thin-film transistor array substrate according to some embodiments of the present disclosure are described.

FIG. 1 is a block diagram for schematically describing the high-resolution digital X-ray detector. The high-resolution digital X-ray detector may include a thin-film transistor array 110, a gate driver 120, a bias supply 130, a readout circuitry 150, and a timing controller 160.

The thin-film transistor array 110 includes a plurality of cell regions formed by a plurality of gate lines GL arranged in a first direction and by a plurality of data lines DL arranged in a second direction transverse to the first direction. In one or more embodiments, the first direction is a horizontal direction and the second direction is a vertical direction. In this embodiment, the first direction and the second direction may be orthogonal or perpendicular to each other. However, other various directions may be contemplated. The cell regions are arranged in a matrix form. In each cell region, photo-sensitive pixels Ps may be formed. The thin-film transistor array 110 detects the X-ray emitted from an X-ray source and converts the detected X-ray into an electrical signal and outputs the electrical signal.

Each photo-sensitive pixel includes a PIN diode which converts light of a visible light region converted from the X-ray by a scintillator into an electronic signal and outputs the electronic signal, and a thin-film transistor TFT which transmits a detected signal output from the PIN diode to the readout circuitry 150. One end of the PIN diode may be connected to the thin-film transistor and the other end thereof may be connected to a bias line BL.

A gate electrode of the thin-film transistor may be connected to the gate line GL which carries a scan signal. Source/drain electrodes of the thin-film transistor may be respectively connected to the PIN diode and a data line DL which carries the detected signal output from the PIN diode. Each bias line BL may extend in a parallel manner to each data line DL.

The gate driver 120 may sequentially apply gate signals to thin-film transistors of photo-sensitive pixels through the gate lines GLs. The thin-film transistors of the photo-sensitive pixels may be turned on in response to the gate signals having a gate-on voltage level.

The bias supply 130 may apply driving voltages to the photo-sensitive pixels through the bias lines BL. The bias supply 130 may selectively apply a reverse bias or a forward bias to the PIN diode.

The readout circuitry 150 may read out the detected signal transmitted from the thin-film transistor turned on in response to the gate signal of the gate driver 120. That is, the detected signal output from the PIN diode may be input to the readout circuitry 150 through the thin-film transistor and the data line DL.

The readout circuitry 150 may read out the detected signal output from each of the photo-sensitive pixels during an offset readout period for reading out an offset image and an X-ray readout period for reading out the detected signal after an X-ray exposure to an object.

The readout circuitry 150 may include a signal detector and a multiplexer. The signal detector includes a plurality of amplification circuits that correspond respectively to the data lines DL. Each amplification circuit may include an amplifier, a capacitor, and a reset element.

The timing controller 160 may generate an initiation signal and a clock signal and supply the initiation signal and the clock signal to the gate driver 120 to control an operation of the gate driver 120. Further, the timing controller 160 may generate a readout control signal and a readout clock signal, and may supply the readout control signal and the readout clock signal to the readout circuitry 150 to control an operation of the readout circuitry 150.

Figure 2:
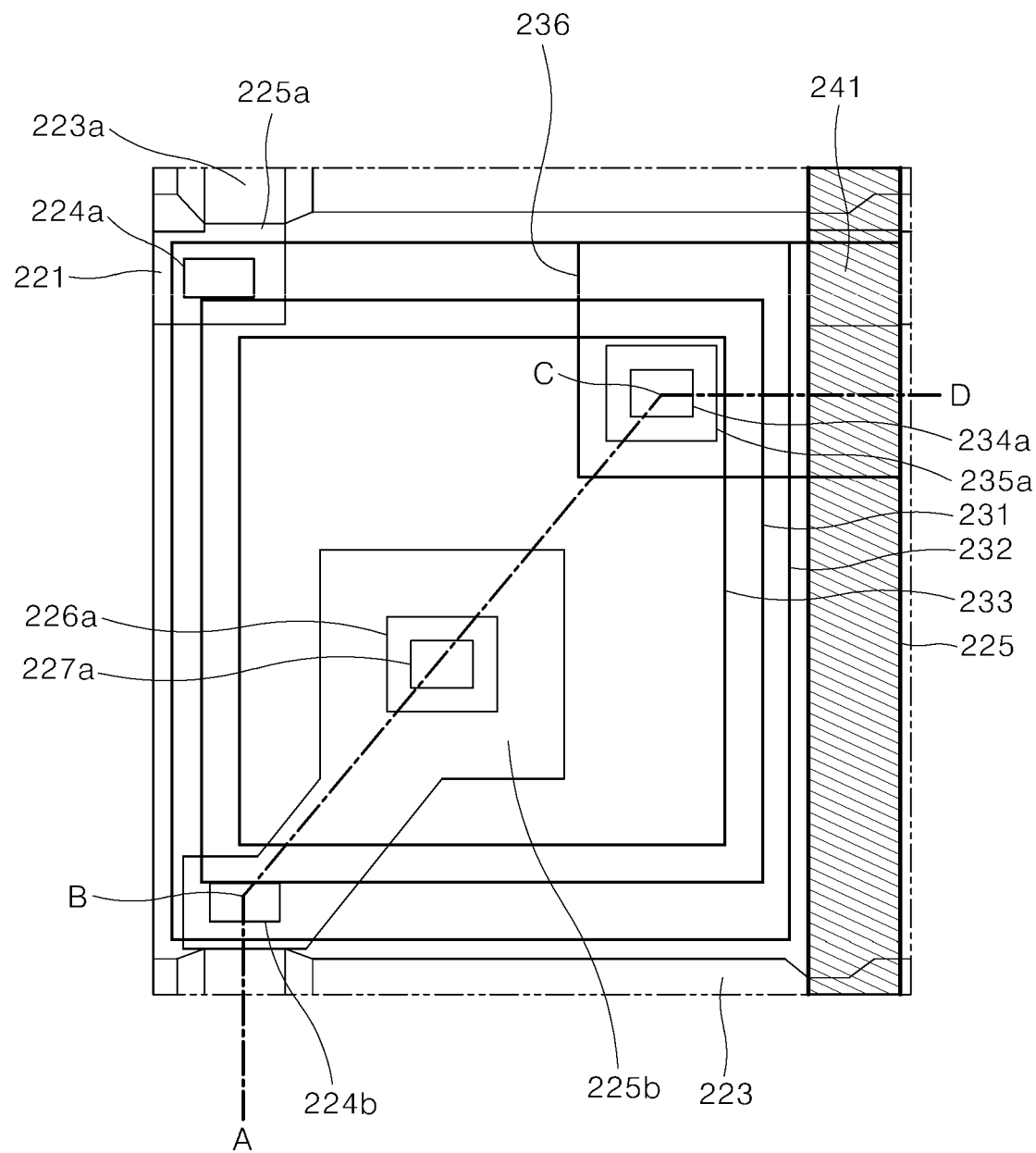
FIG. 2 is a top view of a partial region of a thin-film transistor array substrate for a high-resolution digital X-ray detector according to one embodiment of the present disclosure.
Figure 3:
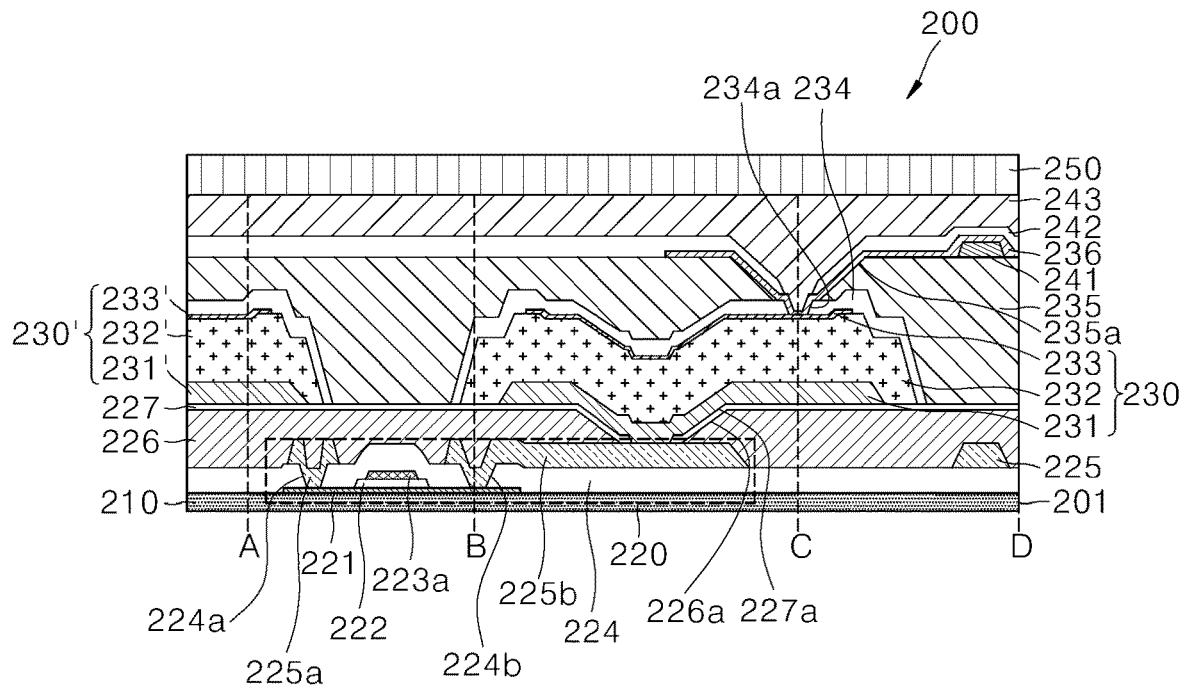
FIG. 3 is a cross-sectional view of a partial region of a thin-film transistor array substrate for a high-resolution digital X-ray detector according to one embodiment of the present disclosure.

FIG. 2 and FIG. 3 respectively show a top view and a cross-sectional view of a partial region of the TFT array substrate for the high-resolution digital X-ray detector according to one embodiment of the present disclosure.

The base substrate 210 may have a plurality of cell regions formed by overlapping between the gate lines 223 extending in one direction and the data lines 225 extending in another direction transverse or orthogonal to the gate lines 223. Each pixel P may correspond to each cell region. A plurality of pixels P may be formed adjacent to the overlapping locations of the gate lines 223 and the data lines 225.

Each thin-film transistor 220 and each PIN diode 230 may be disposed for each pixel. The plurality of thin-film transistors 220 and PIN diodes 230 may be formed on the array substrate 201. Hereinafter, description will be made based on each thin-film transistor 220 and each PIN diode 230 corresponding to one pixel. Unless otherwise specified, the same or similar description may be applicable to an adjacent pixel.

The thin-film transistor 220 including an active layer 221, a gate electrode 223a, and a first electrode 225a and a second electrode 225b connected to the active layer 221 may be formed on a base substrate 210.

Between the base substrate 210 and the thin-film transistor 220, there may be a buffer layer made of an inorganic material such as silicon oxide SiOx.

The active layer 221 may be made of an oxide semiconductor material which may include IGZO (InGaZnO)-based materials. The present disclosure is not limited thereto.

The gate electrode 223a may be formed on the active layer 221. A gate insulating layer 222 may be formed between the active layer 221 and the gate electrode 223a to electrically isolate the active layer 221 from the gate electrode 223a. That is, on the gate insulating layer 222, there may be formed the gate electrode 223a extending from the gate line 223 to correspond to a channel region of the active layer 221. The gate electrode 223a may be embodied as a single layer or multiple layers of conductive material.

In at least one embodiment, the gate electrode 223a may extend from the gate line 223. For example, the gate line 223 and the gate electrode 223a are monolithic so that the gate line 223 may be used as the gate electrode 223a. That is, the gate line 223 and the gate electrode 223 may be formed as a single, contiguous, and continuous structure. In addition, the gate line 223 and the gate electrode 223a may define the same layer. The gate line 223 and the gate electrode 223a may be formed in the same layer. Hereinafter, an example in which the gate line 223 is used as the gate electrode 223a as shown in FIG. 3 will be described. In other embodiments, the gate electrode 223a may be formed separate from the gate line 223.

The gate insulating layer 222 may be formed to correspond to the gate electrode 223a. However, the present disclosure is not limited thereto. The gate insulating layer 222 may be formed to have the same or larger area as that of the gate electrode 223a for effective insulation.

The gate electrode 223a and the gate insulating layer 222 may be formed on a middle region of the active layer 221. Therefore, a source region and a drain region may be respectively formed as both end regions of the active layer 221 other than the channel region of the active layer 221, where the both end regions are not covered by the gate electrode 223a and are exposed.

The source region and the drain region of the active layer 221 may be respectively formed by converting the both end regions of the active layer 221 to conductive regions. The both end regions of the active layer 221 may be converted to the conductive regions via various methods such as a dry etching method, a hydrogen plasma treatment, a helium plasma treatment and the like.

The source region of the active layer 221 may be disposed closer to the PIN diode 230 than the drain region thereof may be. However, the present disclosure is not limited thereto. The drain region of the active layer 221 may be disposed closer to the PIN diode 230 than the source region thereof may be.

Further, the active layer 221 may be formed of amorphous silicon (a-Si) other than the oxide semiconductor material. The material used for forming the active layer 221 is not particularly limited.

An inter-layer insulating layer 224 may be formed on the gate electrode 223a to cover the base substrate 210. On the inter-layer insulating layer 224, the first electrode 225a and the second electrode 225b may be formed.

The first electrode 225a and the second electrode 225b may be respectively formed to overlap the both end regions of the active layer 221, such that the gate electrode 223a is horizontally interposed between the first electrode 225a and the second electrode 225b. A first contact hole 224a and a second contact hole 224b may be formed in the inter-layer insulating layer 224 such that the first contact hole 224a and second contact hole 224b are vertically interposed between one end region of the active layer 221 and the first electrode 225a and between the other end region of the active layer 221 and the second electrode 225b, respectively.

Specifically, the first contact hole 224a may be formed to correspond to the drain region of the active layer 221, while the second contact hole 224b may be formed to correspond to the source region of the active layer 221. Accordingly, the first electrode 225a may be connected to the drain region of the active layer 221 via the first contact hole 224a, while the second electrode 225b may be connected to the source region of the active layer 221 via the second contact hole 224b.

The first electrode 225a and the second electrode 225b may extend from the data line 225. The first electrode 225a and the second electrode 225b and the data line 225 may be formed at the same layer. In one embodiment, the first electrode 225a may act as a drain electrode, while the second electrode 225b may act as a source electrode.

A first planarization layer 226 made of an inorganic material may be formed on the thin-film transistor 220. The first planarization layer 226 may cover the first electrode 225a and the second electrode 225b.

In one or more embodiments, the first planarization layer 226 may be formed of a layer of organic material, which is much thicker than an inorganic layer. Thus, parasitic capacitance that may occur between electrodes or interconnects sandwiching the first planarization layer 226 therebetween may be reduced or minimized. However, in other embodiments, the thickness of the layers may vary based on different applications.

Further, the first planarization layer 226 may have a planarized top face regardless of a shape of the underlying electrode or elements, thereby to reduce or minimize a curved portion. This may enhance stability of an element such as the PIN diode 230, which may be formed on the first planarization layer 226.

The planarization layer 226 may be made of an organic material such as an acrylic resin such as photo acryl (PAC). However, the present disclosure is not limited thereto. A material such as PR (photo resist) may be used for the planarization layer 226.

On the first planarization layer 226, a first protective layer 227 may be formed, which is an inorganic layer made of an inorganic material. The first protective layer 227 protects the underlying thin-film transistor 220, particularly the active layer 221.

In a case where the active layer 221 is made of an oxide semiconductor material, the first protective layer 227 may include silicon oxide, but may be free of silicon nitride. Silicon nitride has a high moisture content. Thus, if the first protective layer 227 includes silicon nitride, the moisture may invade the active layer 221 made of an oxide semiconductor beneath the first protective layer 227, and, thus, and the active layer 221 may become conductive, thereby damaging the active layer 221.

However, when the active layer 221 is made of an amorphous silicon material, the active layer 221 may not be sensitive to moisture. Thus, the first protective layer 227 may include silicon nitride as well as silicon oxide to further enhance the protective performance.

Further, the first protective layer 227 made of an inorganic material may further facilitate the adhesion between organic planarization layers.

The PIN diode 230 may be formed on the first planarization layer 226. Each PIN diode 230 may be disposed in each cell region. The PIN diode 230 may include a third electrode 231 connected to the thin-film transistor 220, a PIN layer 232 on the third electrode 231, and a fourth electrode 233 on the PIN layer 232.

The third electrode 231 may serve as a pixel electrode as a lower electrode in the PIN diode 230. The third electrode 231 may be made of an opaque metal such as molybdenum (Mo) or a transparent oxide such as ITO (Indium Tin Oxide), IZO (Indium Zinc Oxide) or ZnO (Zinc Oxide) depending on characteristics of the PIN diode. The material used for forming the third electrode 231 is not particularly limited.

The third electrode 231 may be connected to the second electrode 225b of the thin-film transistor 220 via a third contact hole 226a in the first planarization layer 226. When there is the first protective layer 227 between the first planarization layer 226 and the third electrode 231, the first protective layer 227 may have a fourth contact hole 227a formed therein. The fourth contact hole 227a may be formed at the same position as the third contact hole 226a, and may be located inwardly of the third contact hole 226a. Therefore, in at least one embodiment, a size of the fourth contact hole 227a may be smaller than that of the third contact hole 226a.

Thus, in the presence of the first protective layer 227, the third electrode 231 may be connected to the second electrode 225b of the thin-film transistor 220 via the first third contact hole 226a and the fourth contact hole 227a.

A PIN layer 232 may be formed on the third electrode 231 to convert visible light converted from an X-ray via a scintillator into an electric signal. The PIN layer 232 may be formed by sequentially stacking an N (negative) type semiconductor layer including an N type impurity, a I (intrinsic type) semiconductor layer not including an impurity, and a P (positive) type semiconductor layer including a P type impurity.

The I-type semiconductor layer may be relatively thicker than the N-type semiconductor layer and the P-type semiconductor layer. The PIN layer 232 contains a material capable of converting visible light from the scintillator into an electrical signal. For example, the material capable of converting visible light from the scintillator into the electrical signal may include a-Se, $HgI_2$, CdTe, PbO, $PbI_2$, $BiI_3$, GaAs, and Ge.

The fourth electrode 233 may be formed as an upper electrode on the PIN layer 232. The fourth electrode 233 may be made of at least one of transparent oxides such as ITO (Indium Tin Oxide), IZO (Indium Zinc Oxide), and ZnO (Zinc Oxide) to improve a fill factor of the PIN diode 230.

In the high resolution digital X-ray detector, as a resolution thereof increases, more pixels are needed. However, in a case where the resolution increases in a state where a total area in which the pixels may be formed is fixed, as a size of a cell region corresponding to one pixel decreases, a size of each pixel decreases.

As a result, a size of the PIN diode 230 included in each pixel is reduced. As a result, the fill factor of the PIN diode 230 is reduced. Accordingly, a photo-sensitivity of the digital X-ray detector may deteriorate.

The fill factor refers to a ratio of a light receiving area to a single pixel area in the X-ray detector. In other words, the fill factor may be based on a ratio of an area of the PIN diode 230 to a single pixel area.

Therefore, as the fill factor decreases, and even when the same amount of visible light is irradiated to the PIN diode, the amount of an electric signal converted also decreases due to the reduction of the light receiving area, which in turn degrades the overall performance of the X-ray detector. The degradation of the photo-sensitivity of the digital X-ray detector may eventually lead to the performance degradation of the digital X-ray detector.

Therefore, in at least one embodiment, it is beneficial to increase or maximize the area of the PIN diode 230 to improve the fill factor in order to prevent the photo-sensitivity degradation of the high-resolution digital X-ray detector.

Accordingly, in accordance with the present disclosure, the present inventor attempts to increase the fill factor of the PIN diode 230 by making the PIN diode 230 included in one pixel as wide as possible. For this purpose, the PIN diode 230, specifically, the PIN layer 232 may be formed over the entire surface of the cell region corresponding to one pixel. That is, the PIN diode 230 may be formed over the entire surface of the cell region except for the gate line 223 and the data line 225.

As described above, the cell regions may be formed by the overlapping between the plurality of gate lines 223 and the plurality of data lines 225. Thus, the gate line 223 and the data line 225 may act as boundaries between adjacent cell regions.

In one example, the area of the PIN diode 230 may be increased by arranging the second electrode 225b of the thin-film transistor 220 and the PIN diode 230 so that the second electrode 225b of the thin-film transistor 220 is disposed inside the PIN diode 230. In this case, not only the second electrode 225b but also the second contact hole 224b may be disposed inside the PIN diode 230, so that the PIN diode 230 may have a wider area. In other words, not only the second electrode 225b but also the second contact hole 224b may vertically overlap and may be located below the PIN diode 230.

In some embodiments, the PIN diode 230 overlies or overlaps the second electrode 225b of the thin-film transistor 220. In these embodiments, not only the second electrode 225b but also the second contact hole 224b may be located to overlap with the PIN diode 230. This will allow the PIN diode 230 to have a wider area.

In some embodiments, the PIN diode 230 at least partially overlaps the second electrode 225b of the thin-film transistor 220. In these embodiments, not only the second electrode 225b but also the second contact hole 224b may be located to partially overlap with the PIN diode 230.

In some embodiments, the PIN diode 230 completely overlaps the second electrode 225b of the thin-film transistor 220. In these embodiments, not only the second electrode 225b but also the second contact hole 224b may be located to completely overlap with the PIN diode 230.

Further, the first contact hole 224a of the thin-film transistor 220 may be disposed inside another PIN diode 230' adjacent to the PIN diode 230 overlapping the second contact hole 224b. As the total area of the PIN diodes 230 increases across the plurality of pixel regions, the total fill factor of the PIN diodes 230 may be increased.

As the second electrode 225b of the thin-film transistor 220 is disposed inside the PIN diode 230, the second electrode 225b may be positioned to overlap with the third electrode 231 of the PIN diode 230. Further, the third contact hole 226a formed in the first planarization layer 226 may be disposed inside the PIN diode 230.

That is, the second electrode 225b, the second contact hole 224b, and the third contact hole 226a of the thin-film transistor 220 are overlapped with the PIN diode 230. Thus, the PIN diode 230 may extend up to a region where the second electrode 225b, the second contact hole 224b and the third contact hole 226a are formed. Consequently, the light receiving area increases, such that the fill factor of the PIN diode 230 may be increased.

However, since the second electrode 225b and the third electrode 231 are overlapped with each other, parasitic capacitance may be generated between the second electrode 225b and the third electrode 231. Thus, in accordance with the present disclosure, the generation of parasitic capacitance may be reduced or minimized by forming the first planarization layer 226 made of organic material between the second electrode 225b and the third electrode 231.

Since the first planarization layer 226 is made of organic material, the first planarization layer 226 may be thicker than the layer made of the inorganic material. Thus, a distance between the second and third electrodes can be increased or maximized. Therefore, when the second electrode 225b and the third electrode 231 are overlapped with each other, as in the present disclosure, the generation of the parasitic capacitance may be reduced or minimized by the first planarization layer 226.

In some embodiments, the PIN layer 232 is on the third electrode 231. In some embodiments, the PIN layer 232 is on and covers the third electrode 231. In further embodiments, the third electrode 231 included in the PIN diode 230 may be disposed inside the PIN layer 232. That is, the PIN layer 232 may cover the third electrode 231 so that an entirety of the third electrode 231 is located below the PIN layer 232 and is screened by the PIN layer 232.

As the area of the PIN diode 230 is increased to increase the fill factor, a distance between the corresponding PIN diode 230 and a PIN diode 230' adjacent thereto becomes smaller. Accordingly, the distance between the third electrode 231 of the corresponding PIN diode 230 and another third electrode 231' of the adjacent PIN diode 230' may become smaller. Thus, the PIN diode 230 may experience interference in which the PIN diode 230 may be affected by the third electrode 231' of the adjacent PIN diode 230'. Further, there may be a problem that a horizontal parasitic capacitance may be generated between the third electrodes 231 and 231' which are close to each other.

That is, when the third electrode 231 of the PIN diode 230 is wider than the PIN layer 232 and thus the third electrode 231 extends beyond the PIN layer 232, the distance between the adjacent third electrodes 231 and 231' becomes smaller, such the above problem, that is, the horizontal parasitic capacitance may arise.

In one or more embodiments, the third electrode 231 has a first surface, a second surface, and a third surface. The first surface is opposite of the third surface. For example, the first surface may be a top surface of the third electrode. The third surface may be a bottom surface of the third electrode. A portion of the third surface may contact the second electrode 225b. The second surface may be a side surface between the first surface and the third surface. In one or more embodiments, the PIN layer 232 covers the first surface and the second surface. For example, the PIN layer 232 contacts or directly contacts the first surface and the second surface.

In some embodiments, to address the horizontal parasitic capacitance between the third electrode 231 and the adjacent third electrode 231', the PIN layer 232 is overlain on and covers the top surface and side surfaces of the third electrode 231. Similarly, the PIN layer 232' is overlain on and covers the top surface and side surfaces of the adjacent third electrode 231'. The distance between the third electrode 231 and the adjacent third electrode 231' may be suitably selected to reduce the parasitic capacitance and other electrical interferences. In some examples, the combination of overlaying the PIN layer and maintaining a selected distance between the two electrodes may further reduce the parasitic capacitance and other electrical interferences between components. However, in yet other examples, either maintaining the selected distance or covering the top and side surfaces of the third electrode with a PIN layer may reduce the interferences.

In some embodiments, the PIN layer 232 covers the entirety of the third electrode 231 such that the third electrode 231 is disposed inside the PIN layer 232. Thus, the adjacent third electrodes 231 and 231' may be spaced by a selected distance, thereby to reduce or minimize the interference phenomenon. In other words, the configuration in accordance with the present disclosure increases the area of the PIN diode 230 to increase the fill factor, so that even when the distance between the adjacent PIN diodes 230 and 230' is smaller, the interference phenomenon or parasitic capacitance between the PIN diodes 230 and 230' may be reduced or minimized.

In some embodiments, the PIN diode 230 overlies or overlaps the third electrode 231.

In some embodiments, the PIN diode 230 at least partially overlaps the third electrode 231.

In some embodiments, the PIN diode 230 completely overlaps the third electrode 231. A second protective layer 234 may be formed on the PIN diode 230. The second protective layer 234 may protect the PIN diode 230 from moisture and may be made of an inorganic material. Specifically, the second protective layer 234 may include silicon oxide SiOx or silicon nitride SiNx. In particular, the silicon nitride may act as an effective barrier against penetration of moisture into the PIN diode 230.

However, when the active layer 221 of the thin-film transistor 220 is formed of an oxidized semiconductor material, the second protective layer 234 is preferably patterned to cover only the PIN diode 230 as shown in FIG. 3. This is because silicon nitride contains a large amount of moisture, and, thus, when the second protective layer 234 made of the silicon nitride is formed on the thin-film transistor 220, moisture may invade the active layer 221 such that the active layer 221 may become conductive, thereby damaging the active layer 221.

However, when the active layer 221 of the thin-film transistor 220 is made of an amorphous silicon material, the active layer 221 of the thin-film transistor 220 may not be sensitive to the effect of the moisture. Thus, as shown in FIG. 4, the second protective layer 234 covers the entire surface of the base substrate 210 to cover not only the PIN diode 230 but also the thin film transistor 220, thereby further enhancing the protective performance.

Figure 4:
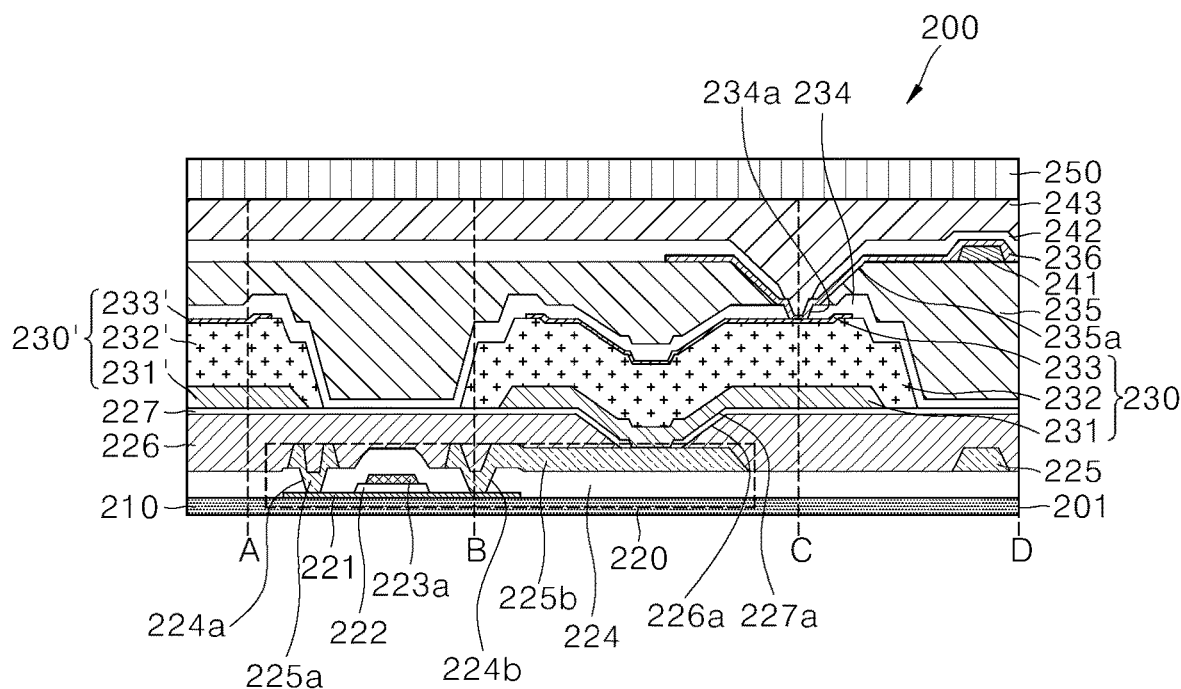
FIG. 4 is a cross-sectional view of a partial region of a thin-film transistor array substrate for a high-resolution digital X-ray detector according to another embodiment of the present disclosure.

In an example of FIG. 4, a separate patterning process of the second protective layer 234 may be omitted to obtain manufacturing process efficiency. Thus, as shown in FIG. 4, a portion of the second protective layer 234 may be present overlying the active layer 221. The PIN diode 230 as well as the thin-film transistor 220 may be additionally protected by the second protective layer 234, thereby to further enhance the stability of the digital X-ray detector.

A second planarization layer 235 may be formed on the second protective layer 234 to cover the entire surface of the base substrate 210 including the PIN diode 230.

The second planarization layer 235 may be formed of a layer made of organic material, which is much thicker than the inorganic material layer. Therefore, parasitic capacitance that may occur between electrodes or interconnects sandwiching the second planarization layer 235 may be reduced or minimized.

The second planarization layer 235 may have a planarized top face regardless of a shape of the underlying electrode or elements, thereby to reduce or minimize a curved portion. The second planarization layer 235 may be made of an organic material such as an acrylic resin such as photo acryl (PAC). However, the present disclosure is not limited thereto. A material such as PR (photo resist) may be used for the second planarization layer 235.

On the second planarization layer 235, a bias line 241 and a fifth electrode 236 may be formed. The fifth electrode 236 may be connected to the fourth electrode 233 via a fifth contact hole 234a formed in the second protective layer 234 and a sixth contact hole 235a formed in the second planarization layer 235.

The sixth contact hole 235a may be formed at the same position as the fifth contact hole 234a. The sixth contact hole 235a may be located outwardly of the fifth contact hole 234a such that the fifth contact hole 234a is exposed to an outside thereto. That is, the sixth contact hole 235a may be wider than the fifth contact hole 234a.

The fifth electrode 236 may be formed of a transparent oxide such as ITO (Indium Tin Oxide), IZO (Indium Zinc Oxide), or ZnO (Zinc Oxide) as in the fourth electrode 233, thereby reducing or minimizing the fill factor decrease of the PIN diode 230.

The fifth electrode 236 may electrically connect the fourth electrode 233 of the PIN diode 230 and the bias line 241, and thus may act as a kind of bridge wiring.

The bias line 241 may be formed between the second planarization layer 235 and the fifth electrode 236. Specifically, the bias line 241 may be formed beneath the fifth electrode 236 and may be in face-contact with the fifth electrode 236. The bias line 241 may be electrically connected to the fourth electrode 233 via the fifth electrode 236 to apply a bias voltage to the PIN diode 230.

In a case where the bias line 241 is formed to overlap the PIN diode 230, the fill factor of the diode 230 may be reduced due to partial overlapping between the bias line 241 and the light receiving region of the PIN diode 230. For this reason, the bias line 241 may be formed outside the PIN diode 230 so as not to overlap with the PIN diode 230.

In this case, the bias line 241 may be formed to overlap the data line 225 and extend along the data line 225. Specifically, the bias line 241 may be formed along the data line 225 so as not to reduce the fill factor of the PIN diode 230, and may be formed to overlap the data line 225. That is, the bias line 241 may be formed so as not to be wider than the data line 225 and may be formed to overlap the data line 225, so that the fill factor of the PIN diode 230 may not be reduced.

In the case where the bias line 241 is formed so as to overlap the data line 225, there may occur a problem of generation of the parasitic capacitance. In accordance with the present disclosure, however, the first planarization layer 226 and the second planarization layer 235 which are composed of organic material may be formed between the bias line 241 and the data line 225. Thus, although the bias line 241 and the data line 225 may be formed to overlap each other, the generation of the parasitic capacitance may be reduced or minimized.

Further, the bias line 241 may be formed to overlap the gate line 223 and along the gate line 223. The details of the case where the bias line 241 is formed so as to overlap the data line 225 as described above may be equally applied to the case when the bias line 241 is formed to overlap the gate line 223 and along the gate line 223.

A third protective layer 242 made of inorganic material may be formed on the fifth electrode 236 to cover the second planarization layer 235. When the active layer 221 of the thin-film transistor 220 is formed of an oxide semiconductor material, the third protective layer 242 preferably includes silicon oxide, but excludes silicon nitride.

However, when the active layer 221 is made of an amorphous silicon material, the active layer 221 may not be sensitive to the moisture. Thus, the third protective layer 242 may include silicon nitride as well as silicon oxide to further enhance the protective performance.

The third protective layer 242 made of inorganic material may facilitate adhesion between the planarization layers made of organic materials.

A third planarization layer 243 may be formed on the third protective layer 242. The third planarization layer 243 may have a planarized top face regardless of a shape of the underlying electrode or elements, thereby to reduce or minimize a curved portion. The third planarization layer 243 may be made of an organic material such as an acrylic resin such as photo acryl (PAC). However, the present disclosure is not limited thereto. A material such as PR (photo resist) may be used for the third planarization layer 243.

On the array substrate 201 according to the present disclosure, a scintillator layer 250 may be formed to cover the PIN diode 230. Since the scintillator layer 250 may be deposited directly on the array substrate 201, planarization of a top surface of the array substrate 201 is required. Thus, the third planarization layer 243 may be formed to planarize the top surface of the array substrate 201. This may facilitate the formation of the scintillator layer 250 on the third planarization layer 243 via deposition of the scintillator material.

The high-resolution digital X-ray detector 200 according to the present disclosure operates as follows.

The X-ray irradiated to the high-resolution digital X-ray detector 200 are converted to light of the visible-light region by the scintillator layer 250. The light of the visible-light region is converted to an electronic signal by the PIN layer 232 of the PIN diode 230.

Specifically, when light of the visible-light region is irradiated to the PIN layer 232, a I-type semiconductor layer is depleted by a P-type semiconductor layer and a N-type semiconductor layer, such that an electric field is generated therein. Then, holes and electrons generated by the light are drifted by the electric field and are collected into the P type semiconductor layer and the N type semiconductor layer, respectively.

The PIN diode 230 converts the light of the visible-light region into the electronic signal and transmits the signal to the thin-film transistor 220. The transmitted electronic signal passes along the data line 225 connected to the thin-film transistor 220 and then is displayed as a video signal.

Hereinafter, a process for manufacturing the digital X-ray detector 200 according to the present disclosure will be described in detail with reference to FIG. 5A to FIG. 5J.

A method of forming a pattern in each layer as described below may employ a photo lithography process including a deposition, a photoresist coating (PR) coating, an exposure, a development, an etching, and a photoresist (PR) strip. Detailed description thereof is omitted. For example, a deposition of a metallic material may employ sputtering. A deposition of a semiconductor or an insulating film may employ plasma enhanced chemical vapor deposition PECVD. In the etching, dry etching and wet etching may be selectively used depending on the material. A technique practiced by an ordinary artisan in the art may be applied to the etching.

Figure 5A:
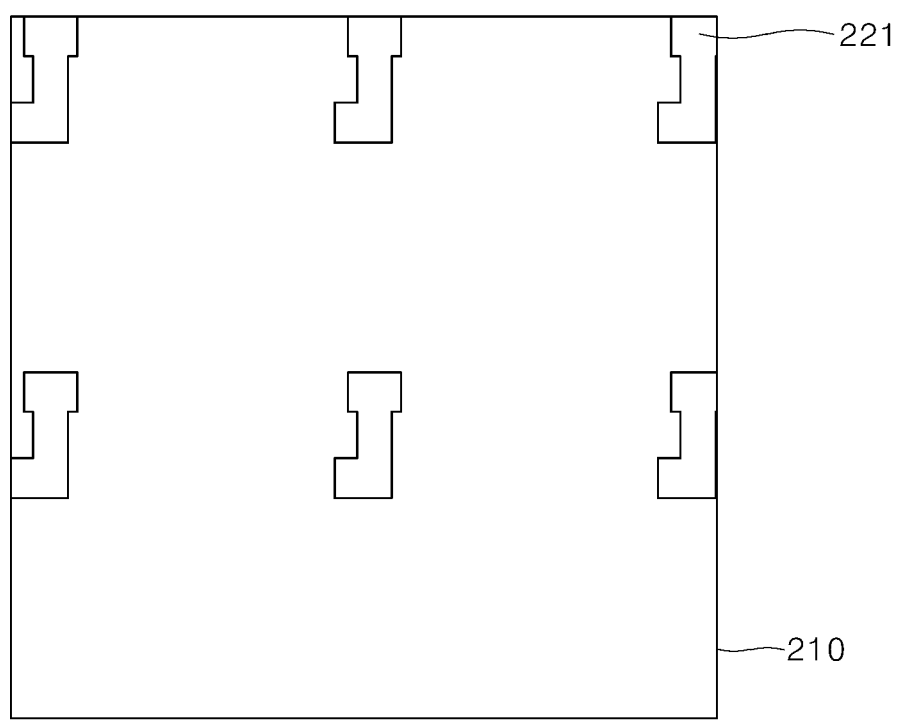
FIG. 5A to FIG. 5J are top views of partial regions of a thin-film transistor array substrate for a high-resolution digital X-ray detector during a process for manufacturing the thin-film transistor array substrate, according to one embodiment of the present disclosure.

First, as shown in FIG. 5A, the active layer 221 is formed on the base substrate 210. The gate insulating layer 222 is formed on the active layer 221.

Figure 5B:
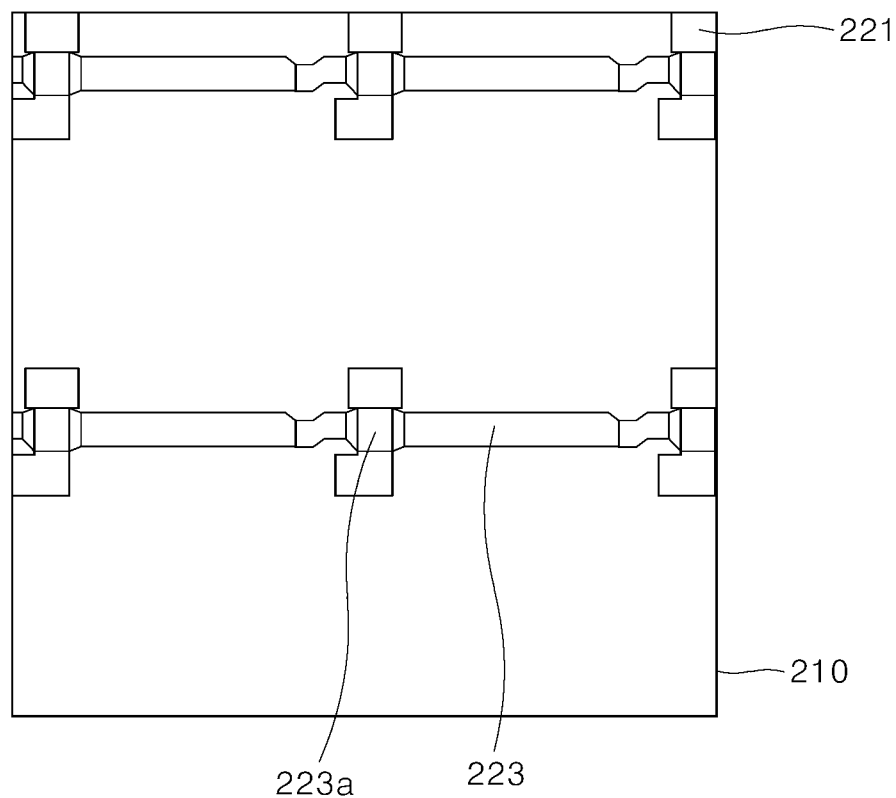

On the gate insulating layer 222, the plurality of gate lines 223 extending horizontally are formed as shown in FIG. 5B. The gate line 223 is formed to connect central portions of adjacent active layers 221 to each other. A portion of the gate line 223 overlapping with the active layer 221 may act as the gate electrode 223a of the thin-film transistor 220.

Figure 5C:
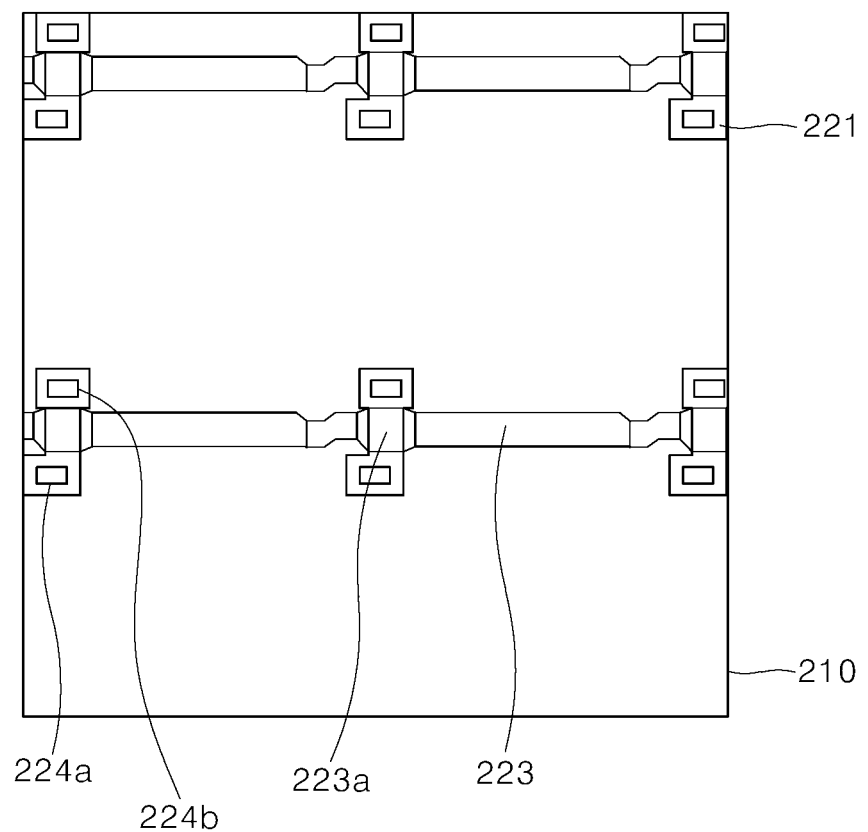

The inter-layer insulating layer 224 is formed on the gate electrode 223a. As shown in FIG. 5C, the first contact hole 224a and the second contact hole 224b are respectively formed in the drain region and source region of the active layer 221 in which the active layer 221 is not overlapped with the gate electrode 223a.

Figure 5D:
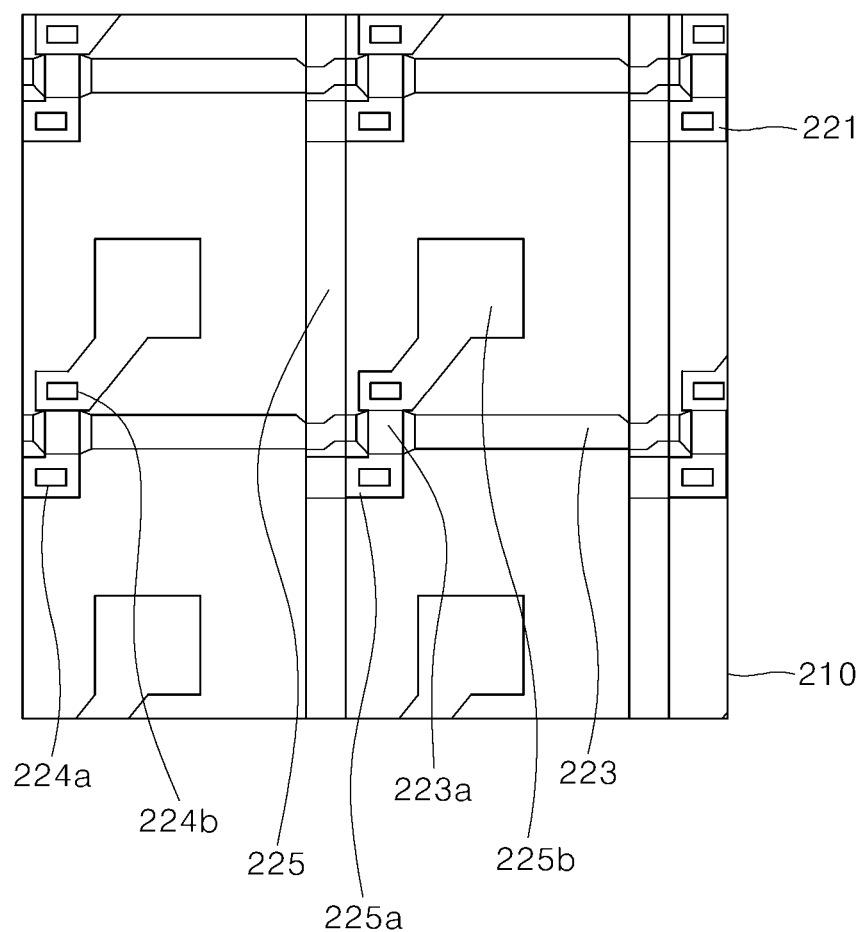

Next, as shown in FIG. 5D, the plurality of data lines 225 are formed to extend in a direction perpendicular to an extension direction of the plurality of gate lines 223 extending horizontally. The first electrode 225a and the second electrode 225b extend from the data line 225 and are connected to the active layer 221 via the first contact hole 224a and the second contact hole 224b, respectively. In this case, the second electrode 225b extends from the data line 225 beyond the active layer 221 so as to be located inside the cell region formed by the overlapping of the gate line 223 and the data line 225. Thus, the second electrode 225b has a large area.

Figure 5E:
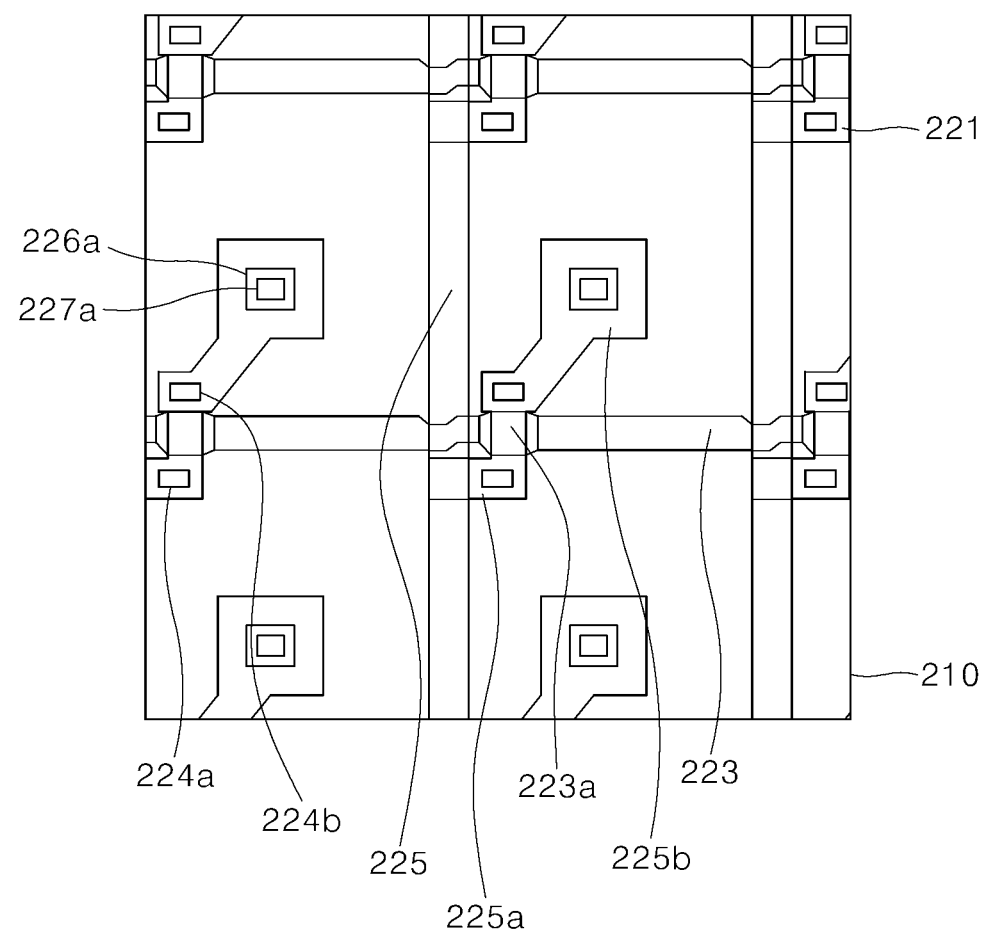

The first planarization layer 226 and the first protective layer 227 are formed on the entire surface of the base substrate 210. As shown in FIG. 5E, the third contact hole 226a and the fourth contact hole 227a are respectively formed in the first planarization layer 226 and the first protective layer 227 in a location corresponding to a location the second electrode 225b located in the cell region. The fourth contact hole 227a is formed at the same position as the third contact hole 226a. The fourth contact hole 227a is formed inside the third contact hole 226a and has a contact hole area smaller than that of the third contact hole 226a.

Figure 5F:
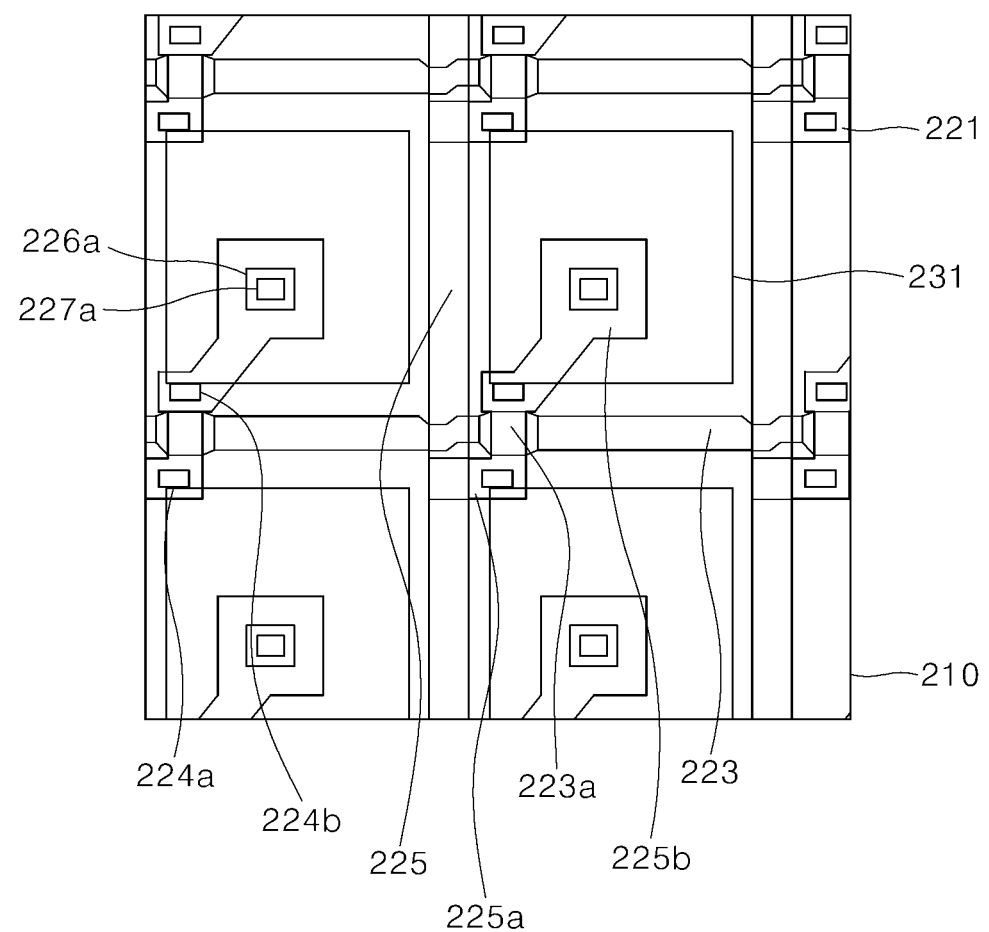

On the first planarization layer 226 and the first protective layer 227, the third electrode 231 as a pixel electrode of the PIN diode 230 is formed as shown in FIG. 5F. The third electrode 231 has a shape conformal to a shape of the cell region. The third electrode 231 has a predetermined spacing from the gate line and the data line so as to be spaced apart from a third electrode 231' of an adjacent pixel by a predetermined distance.

Figure 5G:
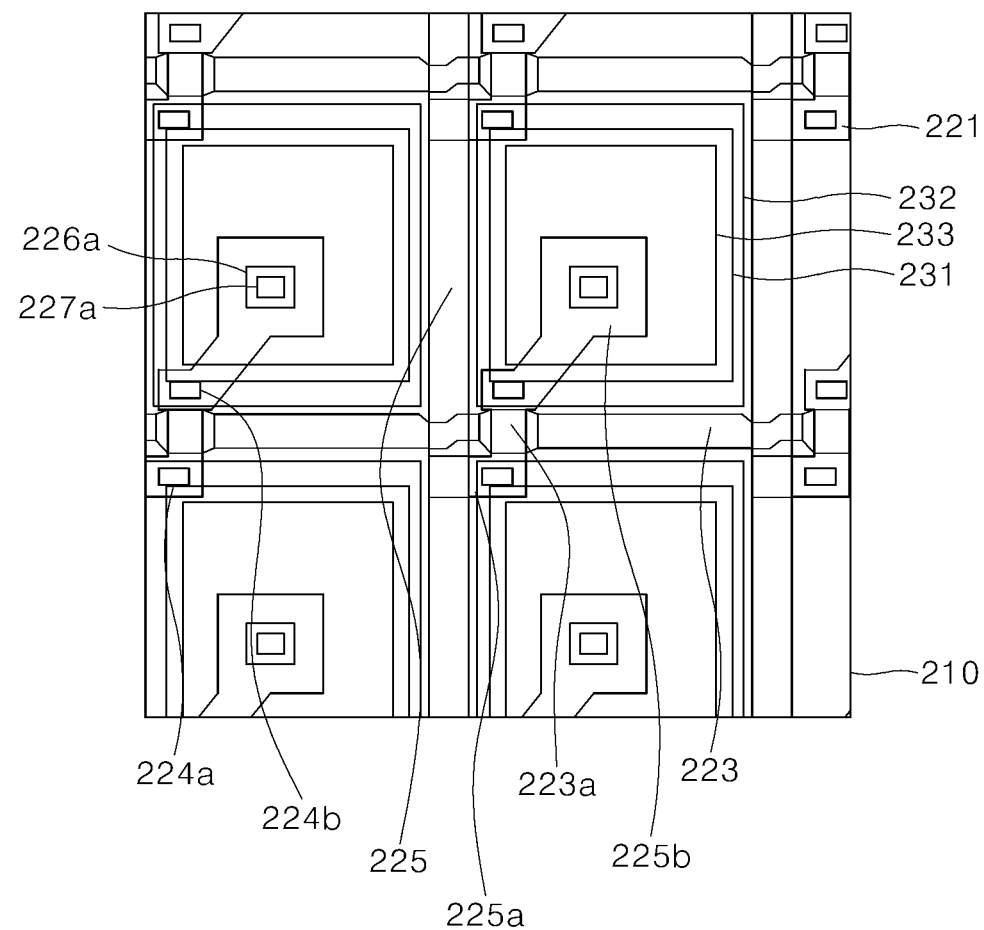

On the third electrode 231, the PIN layer 232 of the PIN diode 230 may be formed as shown in FIG. 5G. The PIN layer 232 covers an entirety of the third electrode 231. In order to increase or maximize the fill factor, the PIN layer 232 may be formed to cover the entire cell region. The fourth electrode 233 may be formed on the PIN layer 232. The fourth electrode 233 is formed to have a predetermined spacing from the gate line and the data line so as to be spaced apart from another fourth electrode 233' of the adjacent pixel by a predetermined distance.

Figure 5H:
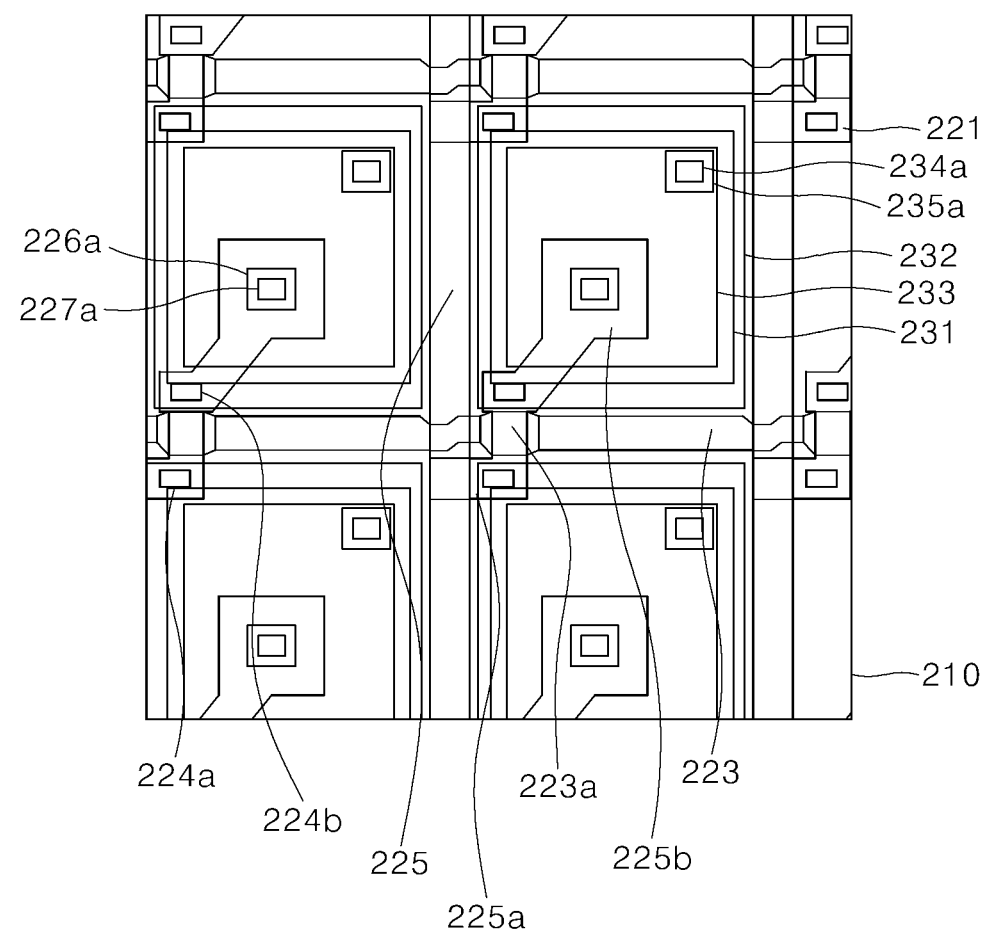

The second protective layer 234 and the second planarization layer 235 are formed on the PIN diode 230. As shown in FIG. 5H, the fifth contact hole 234a and the sixth contact hole 235a are formed in the second protective layer 234 and the second planarization layer 235, respectively in a location corresponding to the fourth electrode 233. The sixth contact hole 235a is formed at the same position as the fifth contact hole 234a. The sixth contact hole 235a is formed outside the fifth contact hole 234a so as to have a contact hole area larger than that of the fifth contact hole 234a.

Figure 5I:
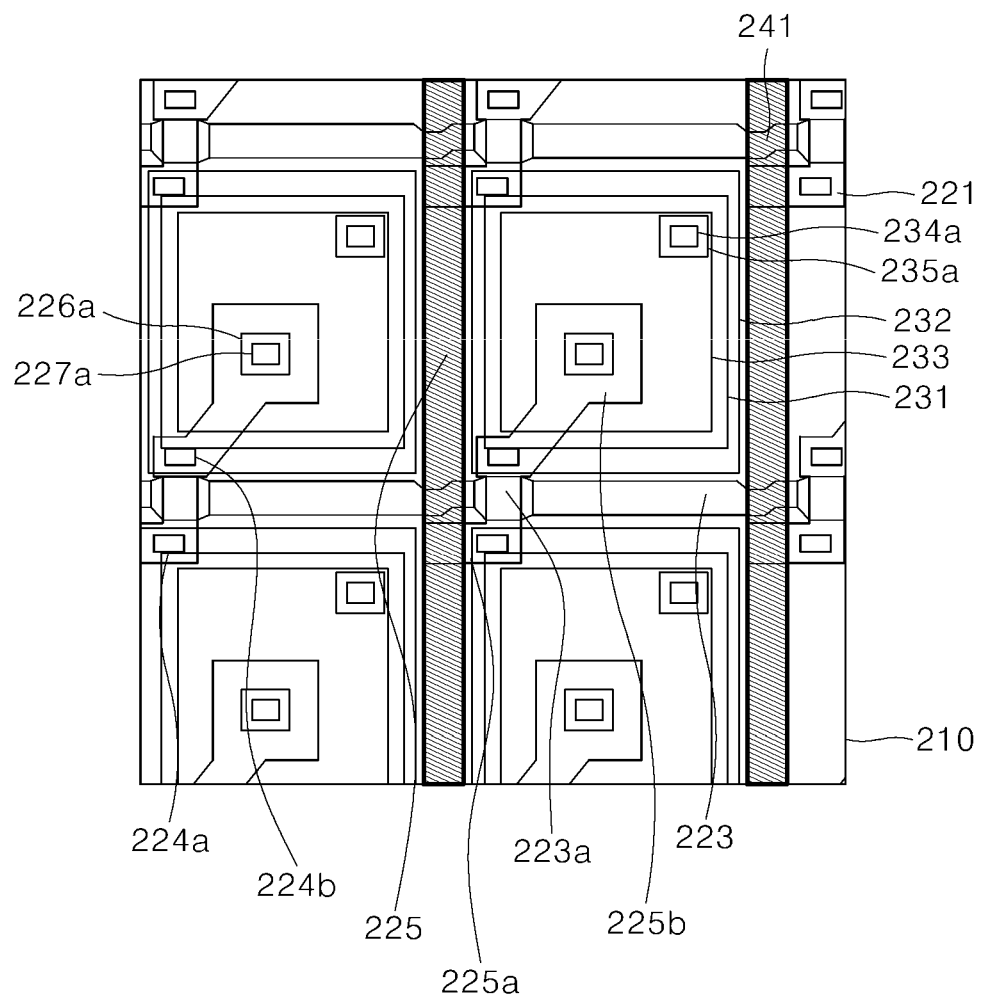
Figure 5J:
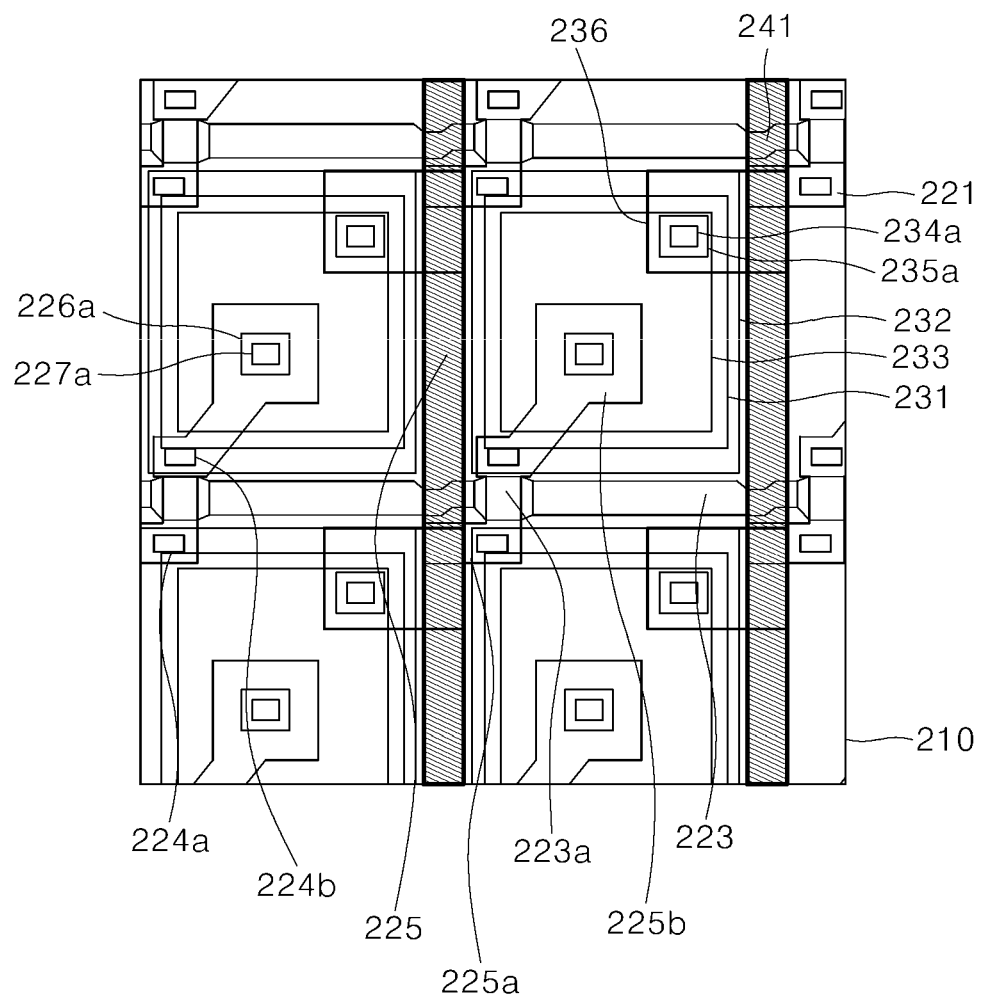

The bias line 241 is formed to overlap the data line 225 and along the data line 225, as shown in FIG. 5I. A portion of the fifth electrode 236 is connected to the fourth electrode 233 via the fifth contact hole 234a and the sixth contact hole 235a, while another portion of the fifth electrode 236 covers and contacts the bias line 241 as shown in FIG. 5J. Thus, the fifth electrode 236 connects the fourth electrode 233 to the bias line 241 to apply a bias voltage to the PIN diode 230.

On the fifth electrode 236, the third protective layer 242 and the third planarization layer 243 may be formed. On the third planarization layer 243, the scintillator layer 250 may be formed by deposition.

The present disclosure is described with reference to the drawings and embodiments. However, the present disclosure is not limited to the embodiments and drawings disclosed herein. It will be apparent that various modifications may be made thereto by those skilled in the art within the scope of the present disclosure. Furthermore, although the effects resulting from the configurations of the present disclosure have not been explicitly in describing the effect resulting from the configurations of the present disclosure, the effects expected from the configurations of the present disclosure should be recognized.

The various embodiments described above can be combined to provide further embodiments. Further changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A thin-film transistor array substrate for a digital X-ray detector, the thin-film transistor array substrate, comprising:
   a base substrate;
   a thin-film transistor disposed on the base substrate, wherein the thin-film transistor includes an active layer, a gate electrode, a first electrode and a second electrode electrically connected to the active layer;
   a first planarization layer disposed on the thin-film transistor; and
   a PIN diode disposed on the first planarization layer, wherein the PIN diode includes a third electrode electrically connected to the thin-film transistor, a PIN layer on the third electrode, and a fourth electrode on the PIN layer;
   wherein the second electrode overlaps the PIN diode, and
   wherein the PIN layer covers the third electrode sufficiently that an entirety of the third electrode is located below the PIN layer and is screened by the PIN layer.

2. The thin-film transistor array substrate of claim 1, wherein the second electrode and the third electrode are electrically connected to each other via a third contact hole formed in the first planarization layer,
   wherein the third contact hole is disposed to overlap the PIN diode.

3. The thin-film transistor array substrate of claim 1, wherein the third electrode is disposed to overlap the PIN layer.

4. The thin-film transistor array substrate of claim 1, wherein the second electrode and the third electrode are positioned so as to overlap with each other.

5. A thin-film transistor array substrate for a digital X-ray detector, the thin-film transistor array substrate, comprising:
- a base substrate;
- a thin-film transistor disposed on the base substrate, wherein the thin-film transistor includes an active layer, a gate electrode, a first electrode and a second electrode electrically connected to the active layer;
- a first planarization layer disposed on the thin-film transistor; and
- a PIN diode disposed on the first planarization layer, wherein the PIN diode includes a third electrode electrically connected to the thin-film transistor, a PIN layer on the third electrode, and a fourth electrode on the PIN layer;
- wherein the second electrode overlaps the PIN diode,
- wherein an inter-layer insulating layer is disposed between the active layer and the first and second electrodes, wherein the active layer is electrically connected to the first electrode and the second electrode respectively via a first contact hole and a second contact hole formed in the inter-layer insulating layer, and
- wherein the second contact hole overlaps the PIN diode.

6. The thin-film transistor array substrate of claim 5, wherein the first contact hole is disposed to overlap a further PIN diode adjacent to the PIN diode.

7. A thin-film transistor array substrate for a digital X-ray detector, the thin-film transistor array substrate, comprising:
- a base substrate;
- a thin-film transistor disposed on the base substrate, wherein the thin-film transistor includes an active layer, a gate electrode, a first electrode and a second electrode electrically connected to the active layer;
- a first planarization layer disposed on the thin-film transistor; and
- a PIN diode disposed on the first planarization layer, wherein the PIN diode includes a third electrode electrically connected to the thin-film transistor, a PIN layer on the third electrode, and a fourth electrode on the PIN layer,
- wherein the second electrode overlaps the PIN diode, and
- wherein the thin-film transistor array substrate further comprises:
  - a second planarization layer on the fourth electrode; and
  - a fifth electrode on the second planarization layer, wherein the fifth electrode is electrically connected to the fourth electrode via a contact hole formed in the second planarization layer.

8. The thin-film transistor array substrate of claim 7, wherein the thin-film transistor array substrate further comprises a bias line formed on the second planarization layer and electrically connected to the fifth electrode,
- wherein the bias line is located to not overlap with the PIN diode.

9. The thin-film transistor array substrate of claim 8, wherein the thin-film transistor array substrate further comprises:
- a gate line present in the same layer as the gate electrode; and
- a data line present in the same layer as the first electrode and the second electrode,
- wherein the bias line overlaps with and extends along the data line or gate line and does not extend beyond the data line or gate line.

10. The thin-film transistor array substrate of claim 9, wherein the bias line is disposed below the fifth electrode, and is in face-contact with the fifth electrode.

11. The thin-film transistor array substrate of claim 7, wherein each of the fourth electrode and the fifth electrode is made of at least one selected from a group consisting of indium tin oxide (ITO), indium zinc oxide (IZO), and zinc oxide (ZnO).

12. The thin-film transistor array substrate of claim 7, wherein the thin-film transistor array substrate further comprises a second protective layer between the second planarization layer and the PIN diode.

13. The thin-film transistor array substrate of claim 12, wherein the second planarization layer is made of an organic material, wherein the protective layer is made of an inorganic material.

14. A thin-film transistor array substrate for a digital X-ray detector, the thin-film transistor array substrate, comprising:
- a base substrate;
- a thin-film transistor disposed on the base substrate, wherein the thin-film transistor includes an active layer, a gate electrode, a first electrode and a second electrode electrically connected to the active layer;
- a first planarization layer disposed on the thin-film transistor; and
- a PIN diode disposed on the first planarization layer, wherein the PIN diode includes a third electrode electrically connected to the thin-film transistor, a PIN layer on the third electrode, and a fourth electrode on the PIN layer;
- wherein the second electrode overlaps the PIN diode, and
- wherein the thin-film transistor array substrate further comprises a first protective layer between the first planarization layer and the PIN diode.

15. The thin-film transistor array substrate of claim 14, wherein the first planarization layer is made of organic material, wherein the protective layer is made of inorganic material.

16. A digital X-ray detector, comprising:
- a thin-film transistor array substrate, the thin-film transistor array substrate including:
- a base substrate;
- a plurality of thin-film transistors disposed on the base substrate, wherein each thin-film transistor includes an active layer, a gate electrode, a first electrode and a second electrode electrically connected to the active layer;
- a planarization layer disposed on the plurality of thin-film transistors;
- a third electrode electrically connected to each of the thin-film transistor;
- a PIN layer on the third electrode; and
- a fourth electrode on the PIN layer,
- wherein the second electrode overlaps the PIN layer; and
- a scintillator layer disposed on the array substrate,
- wherein the plurality of thin-film transistors include a first thin-film transistor and a second thin-film transistor adjacent to the first thin-film transistor, and
- wherein the PIN layer extends between the first thin-film transistor and the second thin- film transistor.

17. A digital X-ray detector comprising:
- a thin-film transistor array substrate, the thin-film transistor array substrate including:
- a base substrate;
- a plurality thin-film transistors disposed on the base substrate, wherein each thin-film transistor includes an active layer, a gate electrode, a first electrode and a second electrode electrically connected to the active layer;
a planarization layer disposed on the plurality of thin-film transistors;
a third electrode electrically connected to each of the thin-film transistor;
a PIN layer on the third electrode;
a fourth electrode on the PIN layer,
wherein the second electrode overlaps the PIN layer; and
a scintillator layer disposed on the array substrate,
wherein the PIN layer surrounds a top surface and a side surface of the third electrode.

18. A device, comprising:
a plurality of pixels;
a thin-film transistor in each pixel of the plurality of pixels;
a PIN diode on thin-film transistor, the PIN diode including,
    a first electrode electrically connected to the thin-film transistor, the first electrode having a first surface, a second surface, and a third surface;
    a PIN layer on the first electrode, the PIN layer directly contacting the first surface and the second surface and the PIN layer surrounding the first surface and the second surface of the first electrode; and
    a second electrode on the PIN layer,
wherein the first surface and the third surface is opposite to each other, the second surface is transverse to the first surface and the third surface,
wherein a portion of the third surface is electrically connected to the thin-film transistor.

19. The device of claim 18, further comprising:
a plurality of data lines extending in a first direction; and
a plurality of gate lines extending in a second direction, the second direction being transverse to the first direction, the plurality of pixels being electrically connected to the plurality of data lines and the plurality of gate lines,
wherein the thin-film transistor includes a gate electrode, the gate electrode being formed by the gate line, and
wherein the PIN layer extends between the gate electrode and the data line.

\* \* \* \* \*